(12) United States Patent
Sugimoto

(10) Patent No.: US 11,394,349 B2
(45) Date of Patent: Jul. 19, 2022

(54) TRANSIMPEDANCE AMPLIFIER

(71) Applicant: SUMITOMO ELECTRIC INDUSTRIES, LTD., Osaka (JP)

(72) Inventor: Yoshiyuki Sugimoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 597 days.

(21) Appl. No.: 16/451,890

(22) Filed: Jun. 25, 2019

(65) Prior Publication Data

US 2020/0007087 A1 Jan. 2, 2020

(30) Foreign Application Priority Data

Jun. 28, 2018 (JP) .............................. JP2018-122921

(51) Int. Cl.
*H03F 1/08* (2006.01)
*H03F 3/68* (2006.01)
*H03G 3/30* (2006.01)
*H03F 3/45* (2006.01)

(52) U.S. Cl.
CPC ......... *H03F 1/086* (2013.01); *H03F 3/45071* (2013.01); *H03F 3/68* (2013.01); *H03G 3/3084* (2013.01); *H03F 2200/129* (2013.01); *H03F 2200/228* (2013.01)

(58) Field of Classification Search
CPC ........ H03F 1/086; H03F 3/45071; H03F 3/68; H03F 2200/129; H03F 2200/228; H03F 3/087; H03F 3/45973; H03F 3/45475; H03F 1/083; H03G 3/3084
See application file for complete search history.

(56) References Cited

U.S. PATENT DOCUMENTS

| 9,496,826 B2* | 11/2016 | Sugimoto | ............. H03F 1/0205 |
| 9,748,908 B1* | 8/2017 | Tan | ............ H03F 3/04 |
| 10,020,784 B1* | 7/2018 | Christensen | ............ H03F 1/083 |
| 10,187,026 B2* | 1/2019 | Zamprogno | ........ H03F 3/45973 |

FOREIGN PATENT DOCUMENTS

| JP | S57-46544 | 3/1982 |
| JP | H11-8522 | 1/1999 |
| JP | 2010-213128 | 4/2010 |

* cited by examiner

*Primary Examiner* — Seung C Sohn
(74) *Attorney, Agent, or Firm* — Smith, Gambrell & Russell, LLP.

(57) ABSTRACT

A variable resistance element is connected between a first input terminal of a first amplifier and a second input terminal of a second amplifier, and has a resistance value between the first input terminal and the second input terminal that is varied according to an amplitude value of a first voltage signal or an amplitude value or a differential voltage signal. A variable current source is connected between the first input terminal and a ground, and controls a current value of a current flowing to the ground from the first input terminal according to a value of an offset of the differential voltage signal. A bias voltage having the same value as that of a bias voltage that is applied to the first input terminal is applied to the second input terminal.

8 Claims, 9 Drawing Sheets

TRANSIMPEDANCE AMPLIFIER

TECHNICAL FIELD

The present disclosure relates to a transimpedance amplifier. This application is based upon and claims the benefit of priority from prior Japanese Patent Application No. 2018-122921, filed Jun. 28, 2018, the entire contents of which are incorporated herein by reference.

BACKGROUND

In an optical receiver, a transimpedance and a photodiode are used. The photodiode generates an optical current on the basis of an optical signal. A transimpedance amplifier (TIA) generates an electrical signal in response to an optical current, which the optical receiver receives from an external optical fiber. Recently, a multiple-value modulation system such as quadrature amplitude modulation (QAM) or pulse amplitude modulation (PAM) is used to implement a high speed and a large capacity of an optical communication system. In such a modulation system, the TIA is required to perform linear amplification with respect to extensive input power. For example, Japanese Unexamined Patent Publication No. S57-46544 discloses a method of connecting variable resistors between an input terminal and a ground of a TIA. The amplitude of the optical current to be input into the TIA decreases as a part of an optical current flows (is drawn out) to the ground through the variable resistors. Accordingly, an amplification action of the TIA is prevented from being saturated, and linearity in the amplification of the TIA is improved. Furthermore, control of decreasing the amplitude of the optical current to be input into the TIA in order to prevent the amplification of the TIA from being saturated is one aspect of so-called auto gain control (AGC), and thus, in this specification, such control will also be referred to as the AGC. Furthermore, examples of the literature relevant to the light receiver further include Japanese Unexamined Patent Publication No. H11-8522 and Japanese Unexamined Patent Publication No. 2010-213128.

SUMMARY

A TIA according to one aspect of the present disclosure is a transimpedance amplifier that receives an input current signal from a photodetector, and outputs a differential voltage signal, the amplifier including: an input terminal configured to receive the input current signal; a first amplifier including a first input terminal electrically connected to the input terminal, and generating a first voltage signal in response to a first current signal input into the first input terminal; a second amplifier including a second input terminal, and generating a second voltage signal in response to a second current signal input into the second input terminal; a differential amplifier electrically connected to the first amplifier, the differential amplifier being configured to generate the differential voltage signal in response to a difference between the first voltage signal and a reference voltage signal; a variable resistance element electrically connected between the first input terminal and the second input terminal, the variable resistance element having a resistance value varied according to an amplitude value of the first voltage signal or an amplitude value of the differential voltage signal; and a variable current source electrically connected between the first input terminal and a ground, the variable current source being configured to vary a current value of a direct current flowing to the ground from the input terminal according to a value of an offset of the differential voltage signal, in which the first input terminal is biased to a voltage value equal to a voltage value to which the second input terminal is biased.

DETAILED DESCRIPTION

Figure 1:
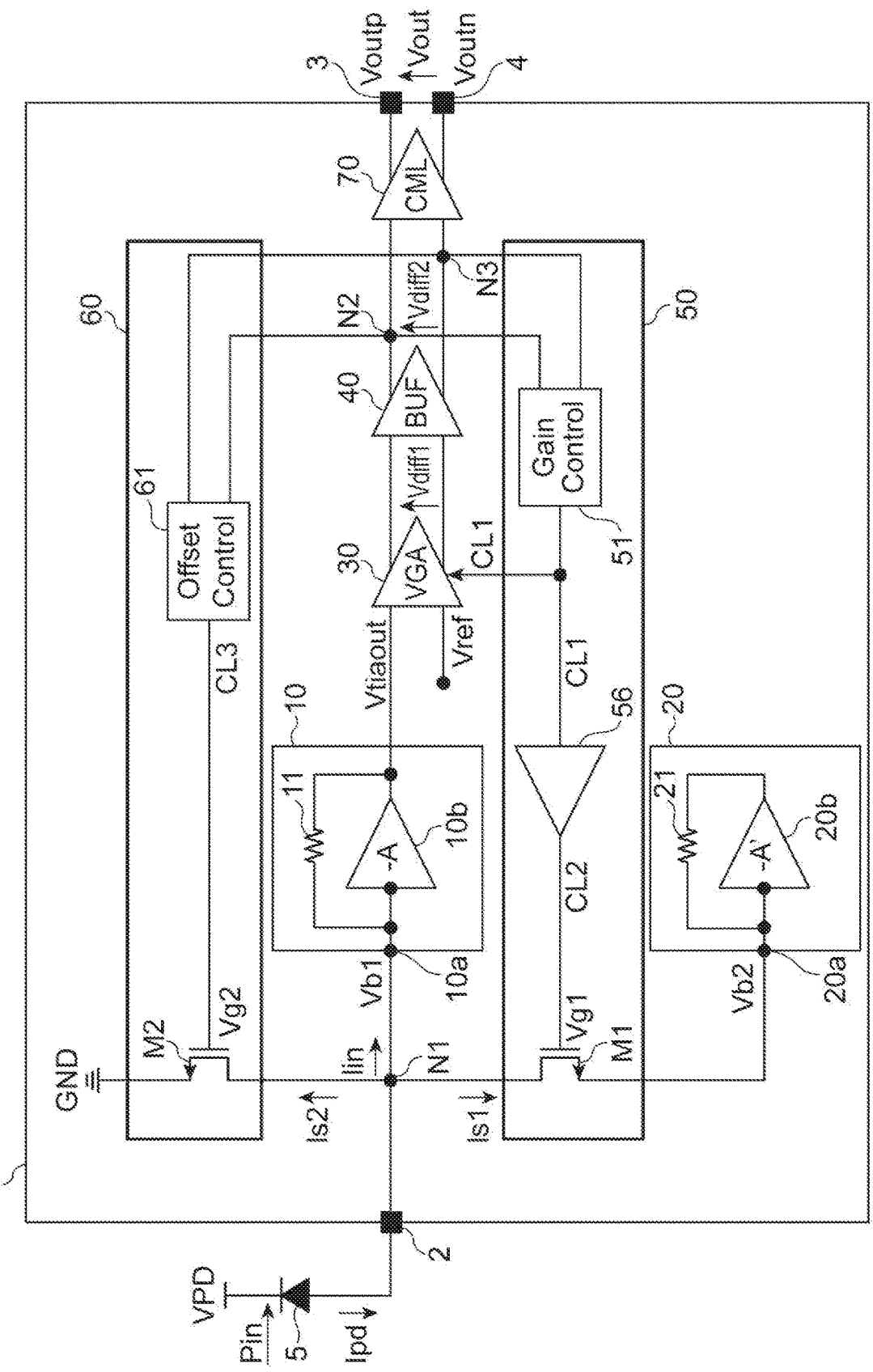
FIG. 1 is a diagram illustrating a schematic configuration of a TIA according to an embodiment.

Hereinafter, a TIA according to an embodiment will be described in detail with reference to the accompanying drawings. In the drawings, the same reference numerals will be applied to the same parts, and the repeated description will be omitted.

FIG. 1 is a diagram illustrating a schematic configuration of a transimpedance amplifier (TIA) 1 according to an embodiment. Hereinafter, each part included in the TIA 1 will be sequentially described.

The TIA 1 includes a terminal 2. The terminal 2 is an input terminal of the TIA 1. An optical current from a photodetector (PD) 5 is input into the terminal 2. The PD 5, for example, is a photodiode. The PD 5 is connected to a power source node VPD, and generates an optical current according to an optical signal that is input. In the TIA 1, the terminal 2 receives an input current signal from the PD 5, and a terminal 3 and a terminal 4 described below outputs a differential voltage signal. A terminal of the PD 5 on a high potential side (for example, a cathode of the photodiode) may be connected to an output terminal of a bias generating circuit that supplies a bias voltage suitable for the PD 5, instead of the power source node VPD. The photodiode is used by applying a reverse bias, and thus, the cathode is connected to a high potential (for example, the power source node VPD), and an anode is connected to a low potential (for example, the input terminal 2 of the TIA 1). The optical current from the PD 5 will be illustrated as a current Ipd. The current Ipd is obtained by converting a signal intensity (optical power) of the optical signal received from the outside into a current signal (an optical current) with the PD 5, and is a high-speed current signal that is changed according to a change in the signal intensity of the optical signal. The value of the optical power is 0 or a positive value, and thus, the current Ipd also basically has 0 or a positive value. For this reason, the current Ipd includes a direct-current component (a DC component) corresponding to a time average of the signal, and an AC component that is changed at a high speed, other than the DC component. The current Ipd is input into a TIA core 10 described below. However, when the amplitude of the current Ipd is greater than a predetermined value, a part of the current Ipd is input into a dummy TIA 20 through a transistor M1 described below, in addition of being input into the TIA core 10, and also flows to a ground (GND) through a transistor M2. A connection portion of the terminal 2, the TIA core 10, the transistor M1, and the transistor M2 will be illustrated as a node N1. In the current Ipd, a current from the node N1 towards the TIA core 10 will be illustrated as a current (a first current signal) Iin. A current from the node N1 towards the transistor M1 will be illustrated as a current (a second current signal) Is1. A current from the node N1 towards the transistor M2 will be illustrated as a current Is2.

The TIA 1 includes the TIA core 10. The TIA core 10 is a transimpedance amplifier (a first amplifier) that changes the current signal to the voltage signal in the TIA 1. The TIA core 10 may be an inverting amplifier. The TIA core 10 includes an input terminal (a first input terminal) 10a that is electrically connected to the input terminal 2. The current (the first current signal) Iin is input into the input terminal 10a. The TIA core 10 generates (outputs) a voltage signal (a voltage Vtiaout: a first voltage signal) according to (based on) the current Iin. A bias voltage (a voltage Vb1) is applied to the input terminal 10a. The TIA core 10, for example, includes a voltage amplifier 10b and a feedback resistance element 11. The voltage amplifier 10b performs inverting amplification, and a gain (a voltage gain) is exemplified as "−A". The gain having a negative value indicates that when a voltage value of the input signal increases, a voltage value of the output signal decreases, and when the voltage value of the input signal decreases, the voltage value of the output signal increases. The resistance element 11 is connected between an output terminal and an input terminal of the voltage amplifier 10b, and the output signal is fed back to the input signal.

Figure 2:
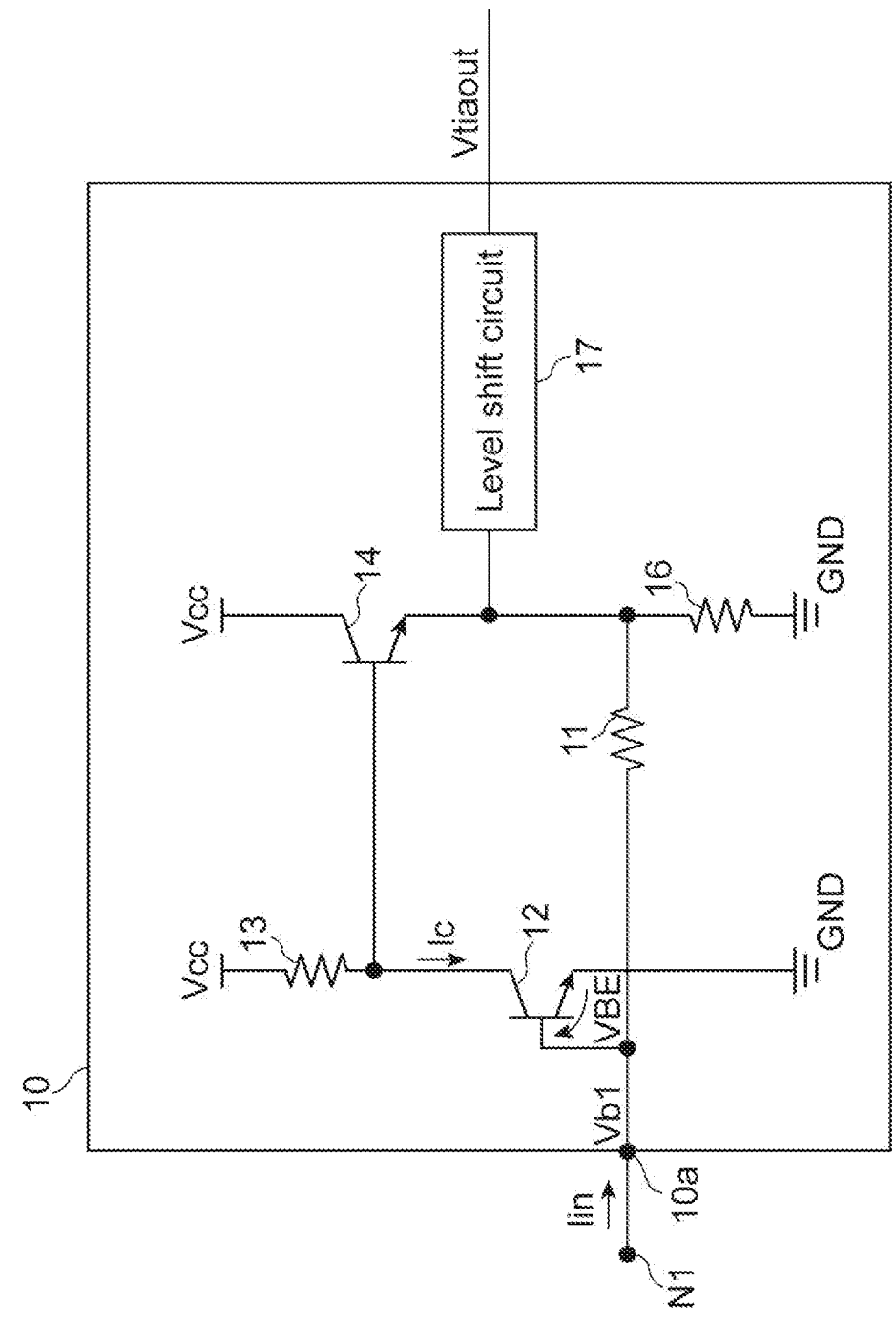
FIG. 2 is a diagram illustrating an example of a circuit configuration of a TIA core.

An example of a circuit configuration of the TIA core (the first amplifier) 10 will be described with reference to FIG. 2. The TIA core 10 includes transistors 12 and 14, resistance elements 11, 13, and 16, and a level shift circuit 17. The transistor 12 and the resistance element 13 configure an inverting amplifier circuit. The transistor 14 and the resistance element 16 configure an emitter follower circuit. The inverting amplifier circuit, the emitter follower circuit, and the level shift circuit 17 are connected in cascade in this order, and configure the voltage amplifier 10b. In this example, the transistor 12 is a bipolar transistor, and a base of the transistor 12 functions as a control terminal of the transistor 12. A collector and an emitter of the transistor 12 respectively function as a first current terminal and a second current terminal of the transistor 12. The transistor 14 also functions as a bipolar transistor, as with the transistor 12.

More specifically, the base of the transistor 12 is electrically connected to the input terminal 10a (that is, the node N1). Therefore, the current Iin is input into the base of the transistor 12. The base of the transistor 12 is also electrically connected to the ground through the resistance element 11 and the resistance element 16. The collector of the transistor 12 is electrically connected to a power source terminal (a power supply line) Vcc through the resistance element 13. The emitter of the transistor 12 is connected to the ground (GND). A voltage according to the current Iin is input into the base of the transistor 12, and thus, a collector current Ic of the transistor 12 flows according to the current Iin. The collector current Ic of the transistor 12 flows through the resistance element 13, and thus, occurs a voltage drop, and a collector voltage is a voltage in which the voltage of the power source terminal Vcc, as a reference potential, decreases by the voltage drop of the resistance element 13. The collector voltage of the transistor 12 is an output signal of the inverting amplifier including the transistor 12 and the resistance element 13. In a case where the current Iin increases, the collector current Ic flowing through the resistance element 13 increases, and thus, the collector voltage decreases. In addition, in a case where the current Iin decreases, the collector current Ic flowing through the resistance element 13 decreases, and thus, the collector voltage increases. As described above, the inverting amplifier circuit including the transistor 12 and the resistance element 13 outputs the output signal (the collector voltage) that is subjected to the inverting amplification according to the current Iin.

Abase of the transistor 14 is electrically connected to the collector of the transistor 12. A collector of the transistor 14 is electrically connected to the power source terminal Vcc. The power source terminal Vcc that is electrically connected to the collector of the transistor 14 and the power source terminal Vcc that is electrically connected to the collector of the transistor 12 through the resistance element 13 may be a common power source terminal. An emitter of the transistor 14 is electrically connected to the ground through the resistance element 16. The base of the transistor 14 corresponds to an input terminal of the emitter follower circuit including the transistor 14 and the resistance element 16. An output signal (the collector voltage of the transistor 12) of the inverting amplifier circuit including the transistor 12 and the resistance element 13 is input into the base of the transistor 14. The emitter follower circuit outputs an emitter voltage of the transistor 14 according to an input signal that is input into the base of the transistor 14, as the output signal. The voltage of the output signal is a voltage that is shifted to a low voltage side by a base-emitter voltage of the transistor 14 with respect to the voltage of the input signal. At this time, a shift amount of the voltage increases and decreases according to a resistance value of the resistance element 16. An output impedance of the emitter of the transistor 14 is less than an input impedance of the base of the transistor 14, and thus, capability of driving a load circuit is improved. The emitter follower circuit has a function of such impedance conversion. In the TIA core 10 illustrated in FIG. 2, the voltage amplifier 10b (FIG. 1) includes the inverting amplifier circuit including the transistor 12 and the resistance element 13, and the emitter follower circuit including the transistor 14 and the resistance element 16. The resistance element 11 is electrically connected between the output terminal (the emitter of the transistor 14) of the emitter follower circuit and the input terminal (the base of the transistor 12) of the inverting amplifier circuit. Accordingly, the output signal of the voltage amplifier 10b is fed back to the input signal through the resistance element 11. According to such a circuit configuration, the current Iin is converted (amplified) into a voltage by the resistance value of the resistance element 11, and thus, the output voltage (the voltage Vtiaout) is generated.

The level shift circuit 17 is connected to the emitter of the transistor 14. The level shift circuit 17 shifts the emitter voltage of the transistor 14 to a level suitable for the output voltage of the TIA core. For example, the output signal of the voltage amplifier 10b is input into a VGA 30, and the emitter voltage of the transistor 14 (the voltage of the input signal) is shifted to a high potential side to be an input level suitable for the VGA 30, and is output. Accordingly, the voltage Vtiaout is obtained. The level shift circuit 17 may be realized by a known circuit configuration. Furthermore, the TIA core 10 exemplified in FIG. 2 includes the level shift circuit 17, but may be omitted according to input properties of the next-stage VGA 30.

In the TIA core 10 described above, an input bias voltage (the voltage Vb1) is set as follows. As illustrated in FIG. 2, the voltage Vb1 is a base-emitter voltage VBE of the transistor 12. The base-emitter voltage VBE is applied as (1) VBE≅$V_T$ ln(Ic/Is). Here, $V_T$ is a thermal voltage (that is proportional to a temperature), and Is is a saturation current (depending on a temperature and a transistor size). In a case where the temperature is constant, the base-emitter voltage VBE is determined by the collector current Ic of the transistor 12. In a case where a base current of the transistor 14 is neglected, the collector current Ic is a current that flows through the resistance element 13. For this reason, the collector current Ic is applied as (2) Ic=(Voltage of Power Source Terminal Vcc−(Base-Emitter Voltage of Transistor 12+Voltage between Terminals of Resistance Element 11+Base-Emitter Voltage of Transistor 14))/(Resistance Value of Resistance Element 13). Finally, the voltage Vb1 converges on a voltage value satisfying (1) and (2) described above. The DC component of the current Iin is retained to be constant by an AOC circuit 60 (FIG. 1) including the transistor M2 described below, and thus, the current of the resistance element 11 is retained to be constant. Therefore, the voltage Vb1 is not affected by an increase and a decrease in the current Ipd (FIG. 1). On the contrary, in a case where there is no AOC circuit 60, the current Iin increases and decreases according to an increase and a decrease in the current Ipd, and affects the current of the resistance element 11 and the collector current of the transistor 14, and thus, also affects the voltage Vb1. In the TIA 1 including the AOC circuit 60, the input bias voltage (Vb1) of the TIA core 10 can be set according to the resistance value of the resistance element 13, electrical properties (the base-emitter voltage) of the transistor 14, the resistance value of the resistance element 11, and electrical properties (the base-emitter voltage) of the transistor 12. Furthermore, the average value (the DC component) of the voltage Vtiaout is controlled such that the average value is approximately identical to a reference voltage (a voltage Vref), according to the action of the AOC of the AOC circuit 60 described below. For this reason, for example, when the current Ipd increases, a current of an increase in the DC component flows to the ground by the transistor M2, as the current Is2. Therefore, the DC component of the current Iin is retained to be constant. The DC component of the current Iin is converted into a voltage by the resistance value of the resistance element 11, and is a DC component of the voltage Vtiaout.

Returning to FIG. 1, the TIA 1 includes the dummy TIA (a second amplifier) 20. The dummy TIA 20 is provided in parallel to the TIA core 10 when it is seen from the terminal 2. The dummy TIA 20 may be an inverting amplifier, as with the TIA core 10. The dummy TIA 20 includes an input terminal (a second input terminal) 20a. The current (the second current signal) Is1 can be input into the input terminal 20a through the transistor M1. The dummy TIA 20 generates (outputs) the voltage signal (the second voltage signal) according to (based on) the current Is1. The dummy TIA 20, for example, includes a voltage amplifier 20b and a feedback resistance element 21. In this example, in the dummy TIA 20, a negative feedback resistance element 21 is connected between an output terminal (a second output terminal) and an input terminal (a second input terminal) of the voltage amplifier 20b, and a gain (a voltage gain) of the dummy TIA 20 is exemplified as "−A'". The dummy TIA 20 may have the same properties as those of the TIA core 10. That is, the voltage amplifier 20b inverts and amplifies the signal that is input into the input terminal, for example. For example, the gain "−A'" of the dummy TIA 20 may be identical to the gain "−A" of the TIA core 10. The output of the dummy TIA 20 may not be connected to an amplifier circuit other than the dummy TIA 20. The dummy TIA 20 may be used as a dummy amplifier.

A circuit configuration of the dummy TIA (the second amplifier) 20 may be the same circuit configuration as that of the TIA core (the first amplifier) 10. For example, in a case where the TIA core 10 has the circuit configuration described above with reference to FIG. 2, the dummy TIA 20 may also have the circuit configuration illustrated in FIG. 2. In this case, a power source identical to the power source (the power source terminal Vcc) of the TIA core 10 may be used in a power source of the dummy TIA 20. The TIA core 10 and the dummy TIA 20 may be prepared in the same manufacturing process. When the circuit configuration of the dummy TIA 20 is identical to the circuit configuration of the TIA core 10 of FIG. 2, an input bias voltage (Vb2) of the dummy TIA 20 is determined as with the input bias voltage (Vb1) of the TIA core 10. In other words, the circuit configuration of the dummy TIA 20 is identical to the circuit configuration of the TIA core 10, including a circuit constant such as the resistance value, or the electrical properties of the transistor, and thus, the input bias voltage (the voltage Vb2) of the dummy TIA 20 can be set to the same value as that of the input bias voltage (the voltage Vb1) of the TIA core 10.

The TIA 1 includes the VGA 30. The VGA 30 is electrically connected to the TIA core 10. The VGA 30 is a differential amplifier that is provided on the next stage of the TIA core 10, and generates (outputs) a differential voltage signal (a voltage Vdiff1) based on the voltage Vtiaout from the TIA core 10. The VGA 30 may be an inverting amplifier. Specifically, the VGA 30 receives the voltage Vtiaout and the voltage Vref, and outputs a differential voltage signal, as the voltage Vdiff1, that is obtained by performing inverting amplification with respect to the voltage Vtiaout on the basis of the voltage Vref. The voltage Vref includes a reference voltage (for example, approximately 1.6 V). The voltage Vref is also referred to as a reference voltage signal. The VGA 30 is a variable gain amplifier, and a gain of the VGA 30 can be controlled by a control signal CL1. The VGA 30 that is capable of controlling the gain as described above may be realized by a known circuit configuration.

The TIA 1 includes a buffer amplifier 40. The buffer amplifier 40 is a differential amplifier that is provided on the next stage of the VGA 30. The buffer amplifier 40 may be a non-inverting amplifier. The buffer amplifier 40 outputs a differential voltage signal (a voltage Vdiff2) based on the voltage Vdiff1 from the VGA 30. The voltage Vdiff2 that is output from the buffer amplifier 40 is also referred to as a differential voltage signal based on the voltage Vtiaout from the TIA core 10. The buffer amplifier 40 may be realized by a known circuit configuration.

The TIA 1 includes a current mode logic (CML) 70. The CML 70 is a differential amplifier that is provided on the next stage of the buffer amplifier 40. The CML 70 may be a non-inverting amplifier. A connection portion between the buffer amplifier 40 and the CML 70 is illustrated as a node N2 and a node N3. A voltage between the node N2 and the node N3 is the voltage Vdiff2 that is output from the buffer amplifier 40. The CML 70 provides driving capability that is required for the TIA 1 to the voltage Vdiff2, and outputs the voltage Vdiff2 to the terminal 3 and the terminal 4 described below.

Furthermore, it is known that a signal logic of a differential signal is inverted by reconnecting a normal phase component and a reverse phase component configuring the differential signal. Accordingly, for example, in a case where an output terminal of the VGA 30 is switched such that a pair of complementary signals that are output from the VGA 30 are switched to each other, the VGA 30 is a non-inverting amplifier. In addition, for example, in a case where an output terminal of the buffer amplifier 40 is switched such that a pair of complementary signals that is output from the buffer amplifier 40 are switched to each other, the buffer amplifier 40 is an inverting amplifier. As described above, for example, even in a case where the VGA 30 is the non-inverting amplifier, and the buffer amplifier 40 is the inverting amplifier, a logical relationship between the current Ipd and a voltage Vout is not changed.

The TIA 1 includes the terminal 3 and the terminal 4. The terminal 3 and the terminal 4 are an output terminal of the TIA 1. The differential voltage signal from the CML 70 is output to the terminal 3 and the terminal 4. The differential voltage signal that is output to the terminal 3 and the terminal 4 is illustrated as the voltage Vout. For example, a normal phase signal (a voltage Voutp) is output to the terminal 3, and a reverse phase signal (a voltage Voutn) is output to the terminal 4.

The TIA 1 includes an AGC circuit 50. The AGC circuit 50 controls the gain of the VGA 30 such that an amplitude value of the voltage Vdiff2 that is output from the buffer amplifier 40 is close to a target value. The gain of the VGA 30 may be controlled such that an amplitude value of the voltage Vdiff1 that is output from the VGA 30 but not the voltage Vdiff2 that is output from the buffer amplifier 40 is close to the target value. For example, when a voltage gain (a differential voltage gain) of the buffer amplifier 40 is set to a predetermined value, the buffer amplifier 40 performs a linear amplification operation with the voltage gain that is set, and the amplitude value of the voltage Vdiff2 is detected, the detected amplitude value of the voltage Vdiff2 is divided by the voltage gain of the buffer amplifier 40, and thus, it is possible to obtain the amplitude value of the voltage Vdiff1. Further, the AGC circuit 50 controls an amplitude value of the current Iin that is input into the TIA core 10 such that the TIA 1 is not saturated to cause distortion. In particular, the saturation of the TIA 1 indicates the saturation of at least one amplification action of the TIA core 10, the VGA 30, the buffer amplifier 40, and the like.

The AGC circuit 50 includes a gain control circuit 51, an amplifier 56, and the transistor M1. The gain control circuit 51 outputs the control signal CL1 on the basis of the voltage (the voltage Vdiff2) of the node N2 and the node N3.

Figure 3:
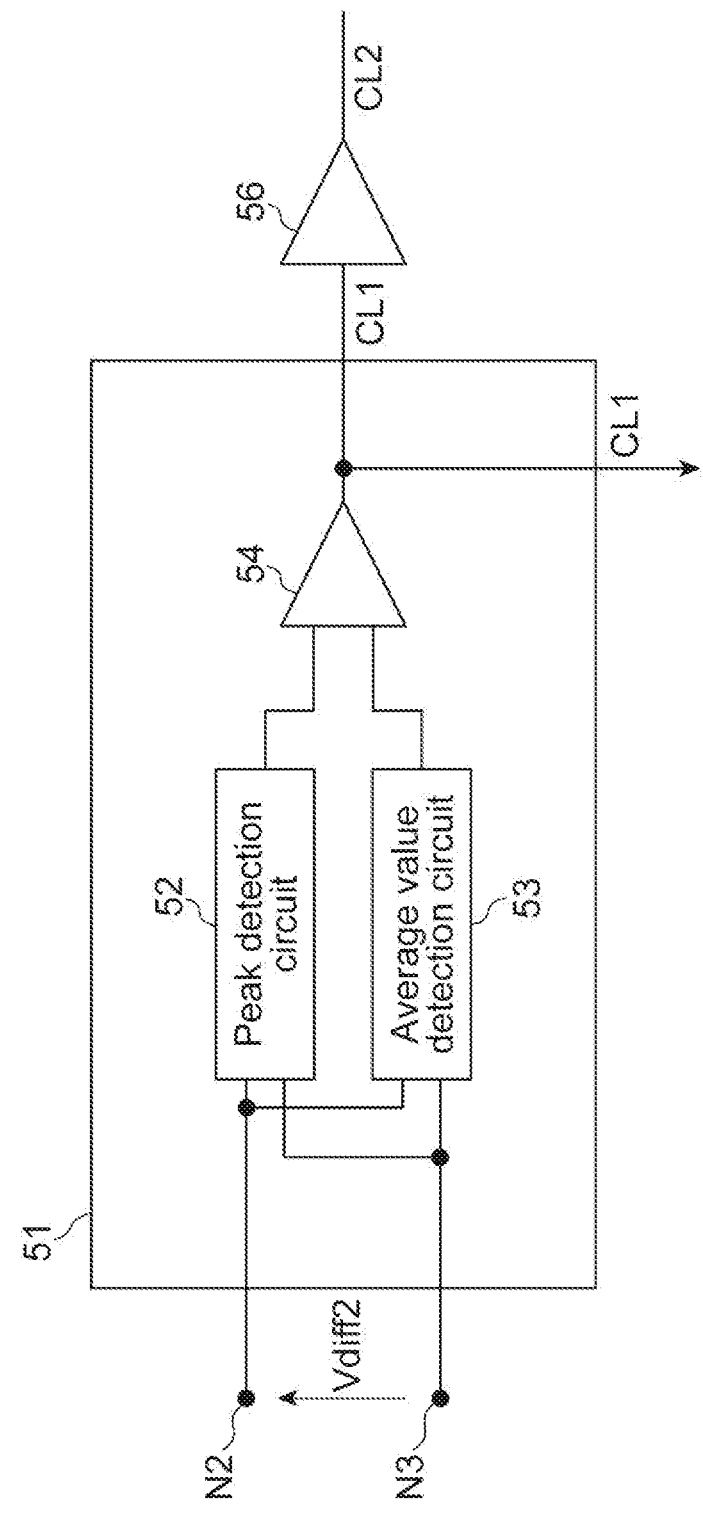
FIG. 3 is a diagram illustrating an example of a circuit configuration of a gain control circuit.

FIG. 3 illustrates an example of a circuit configuration of the gain control circuit 51. The gain control circuit 51 includes a peak detection circuit 52, an average value detection circuit 53, and an amplifier 54. The peak detection circuit 52 detects a peak value of the voltage Vdiff2, and outputs a voltage of a value according to the peak value that is detected. The average value detection circuit 53 detects an average value (the value of the direct-current component) of the voltage Vdiff2, and outputs a voltage of a value according to the average value that is detected. The amplifier 54 outputs an output voltage of the peak detection circuit 52, and a voltage (half of the amplitude value of the voltage Vdiff2) according to a difference with respect to the output voltage of the average value detection circuit 53. Therefore, the voltage that is output from the amplifier 54 is a voltage according to the amplitude value of the voltage Vdiff2. The voltage that is output from the amplifier 54 is a voltage suitable for gain control of the VGA 30, and is used as the control signal CL1. For example, the voltage of the control signal CL1 increases as the amplitude value of the voltage Vdiff2 increases (that is, as the current (the first current signal) Iin increases). The control signal CL1 is sent to the VGA 30, and is also sent to the amplifier 56. Furthermore, in the gain control circuit 51, for example, a bottom detection circuit may be used instead of the peak detection circuit 52. A voltage according to a bottom value of the voltage Vdiff2 that is output from the bottom detection circuit is subtracted from a voltage according to the average value of the voltage Vdiff2 that is output from the average value detection circuit 53, and thus, it is possible to output a voltage corresponding to half of a peak-to-peak amplitude value of the voltage Vdiff2. The peak-to-peak amplitude value corresponds to a value obtained by subtracting the bottom value from the peak value.

Returning to FIG. 1, the amplifier 56 converts the control signal CL1 that is output from the gain control circuit 51 into a voltage suitable for the control of the transistor M1, and outputs the signal. The signal that is output from the amplifier 56 is illustrated as a control signal CL2. For example, the voltage of the control signal CL2 increases as the voltage of the control signal CL1 increases (as the amplitude value of the voltage Vdiff2 increases, and as the current (the first current signal) Iin increases).

In this example, the transistor M1 is a field effect transistor (FET), a gate of the transistor M1 functions as a control terminal of the transistor M1. A drain and a source of the transistor M1 respectively function as a first current terminal and a second current terminal of the transistor M1.

In this embodiment, the transistor M1 is a variable resistance element that is connected between the TIA core (the first amplifier) 10 and the dummy TIA (the second amplifier) 20. The drain of the transistor M1 is electrically connected to the input terminal 10a of the TIA core 10 through the node N1. The source of the transistor M1 is electrically connected to the input terminal 20a of the TIA 20. The gate of the transistor M1 is electrically connected to the amplifier 56. A gate voltage of the transistor M1 is illustrated as a voltage Vg1. The voltage Vg1 is identical to the voltage of the control signal CL2. The voltage Vg1 is changed according to a voltage change in the control signal CL2, and a resistance value between the drain and the source of the transistor M1 is changed. As described above, a resistance value between the input terminal 10a of the TIA core 10 and the input terminal 20a of the dummy TIA 20 is changed by the control signal CL2, and thus, the value of the current Is1 can be controlled. For example, in a case where the voltage Vg1 increases, the resistance value between the drain and the source of the transistor M1 decreases, and the current Is1 increases. In addition, in a case where the voltage Vg1 decreases, the resistance value between the drain and the source of the transistor M1 increases, and the current Is1 decreases. For example, when the voltage of the control signal CL2 is comparatively small, in other words, when the value of the current (the first current signal) Iin is comparatively small (less than a predetermined value), the resistance value between the drain and the source of the transistor M1 is set to a comparatively large value (a first resistance value). When the voltage of the control signal CL2 is comparatively large, in other words, when the value of the current Iin is comparatively large (greater than the predetermined value), the resistance value between the drain and the source of the transistor M1 is set to a comparatively small value (a second resistance value that is less than the first resistance value). Furthermore, when the value of the current Iin is identical to the predetermined value, the resistance value between the drain and the source of the transistor M1 may be set to a value between the first resistance value and the second resistance value.

TIA 1 includes an AOC circuit 60. The AOC circuit 60 controls the value of a direct-current component of the current Iin that is input into the TIA core 10 such that an offset generated in the voltage Vdiff2 that is output from the buffer amplifier 40 is reduced. Furthermore, the offset generated in the voltage Vdiff2 causes an offset generated in the voltage Vdiff1 that is output from the VGA 30, and thus, hereinafter, the offset generated in the voltage Vdiff2 may be read as the offset generated in the voltage Vdiff1, in a timely manner.

Figure 4:
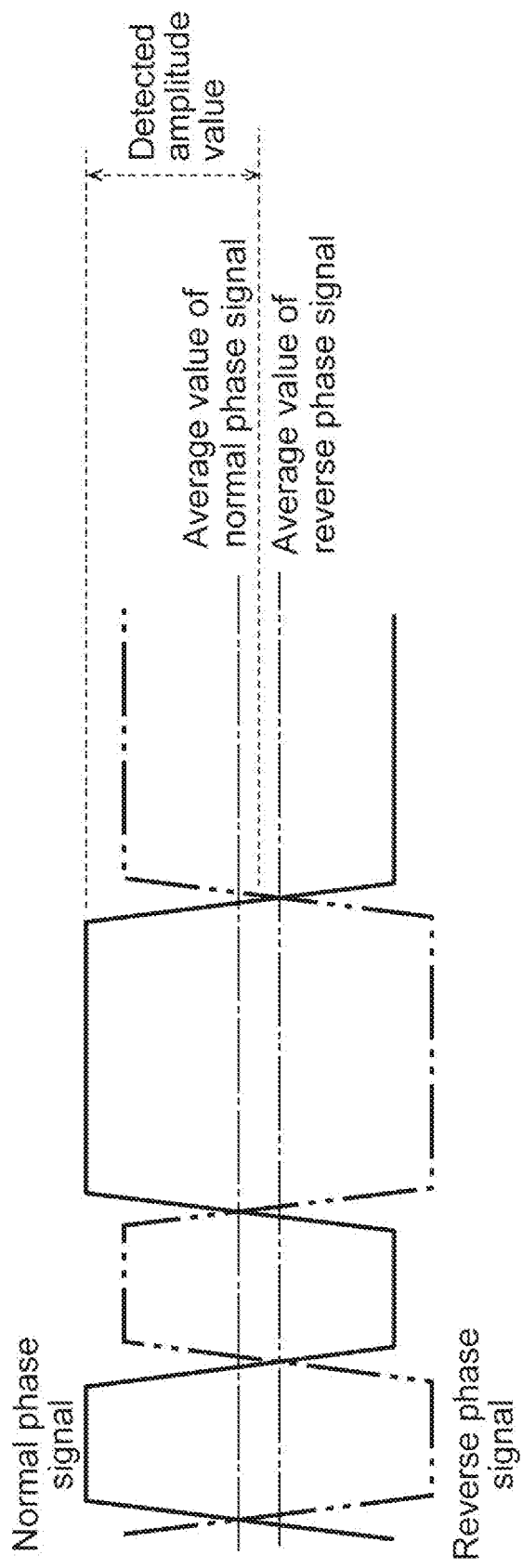
FIG. 4 is a diagram conceptually illustrating an offset.

Here, in the offset (an output offset) that occurs in the differential voltage will be described with reference to FIG. 4. FIG. 4 conceptually illustrates a waveform of the normal phase signal (a normal phase component) and the reverse phase signal (a reverse phase component) of the differential voltage signal. In a case where an offset occurs, an average value of the normal phase signal (the value of the direct-current component) and an average value of the reverse phase signal (the value of the direct-current component) are not coincident with each other. In this example, the amplitude value of the differential voltage signal fluctuates for each half cycle. For example, as with "Detected amplitude value" illustrated in FIG. 4, an amplitude value greater than an amplitude value to be originally detected is detected according to a timing of detecting the differential voltage signal. An amplitude value less than the amplitude value to be originally detected can be detected, at another timing when the reverse phase signal is a peak value. In the example described above, the amplitude value of the voltage Vdiff2 (FIG. 1) is detected by the gain control circuit 51 of the AGC circuit 50, but in a case where an offset occurs in the differential voltage signal as illustrated in FIG. 4, the amplitude value is not correctly detected, and thus, the voltage of the control signal CL1 and the control signal CL2 is shifted. Therefore, in a case where an offset occurs in the voltage Vdiff2 that is output from the buffer amplifier 40, there is a concern that the AGC circuit 50 erroneously detects the amplitude value, and thus, is not normally operated.

Furthermore, in this specification, a state where an average voltage of the normal phase signal is higher than an average voltage of the reverse phase signal indicates a state where the offset is shifted to a plus side. A state where the average value of the normal phase signal is less than the average value of the reverse phase signal indicates a state where the offset is shifted to a minus side. In FIG. 4, a state where the offset is shifted to the plus side is exemplified.

Returning to FIG. 1, the AOC circuit 60 includes an offset control circuit 61 and the transistor M2. The offset control circuit 61 outputs a voltage according to the value of the offset that occurs in the voltage (the voltage Vdiff2) of the node N2 and the node N3. The voltage that is output from the offset control circuit 61 is illustrated as a control signal CL3. The control signal CL3 is a signal suitable for the control of the transistor M2.

Figure 5:
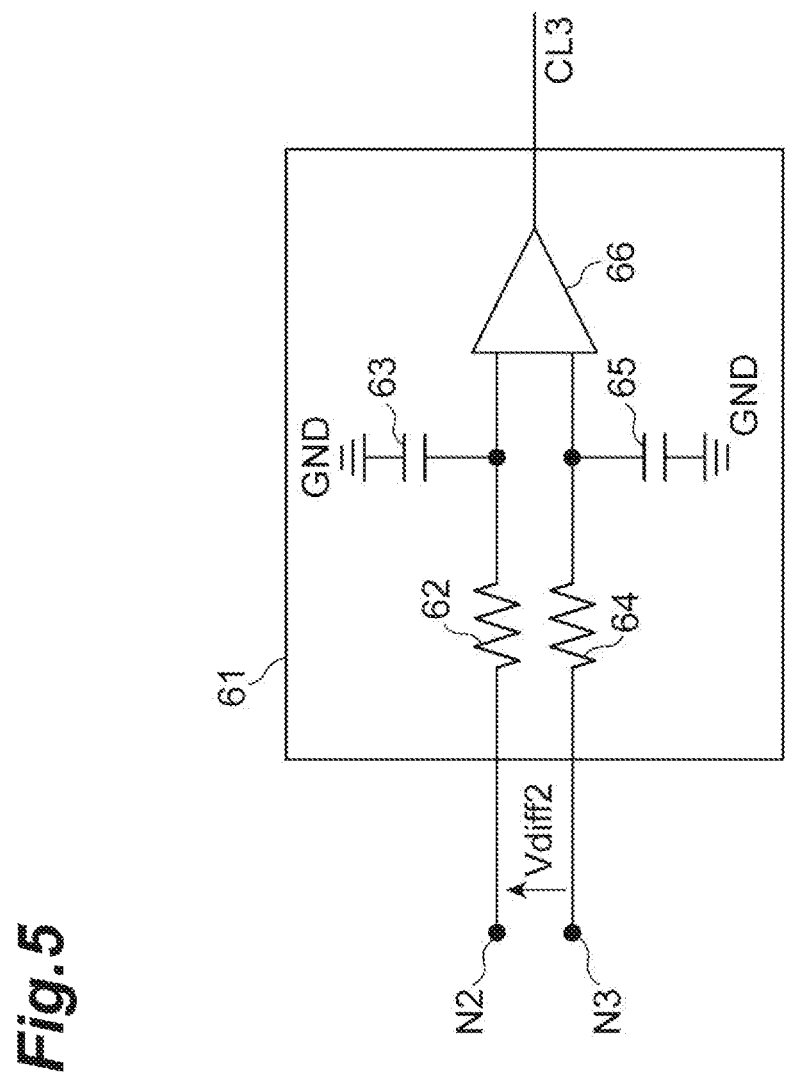
FIG. 5 is a diagram illustrating an example of a circuit configuration of an offset control circuit.

FIG. 5 illustrates an example of a circuit configuration of the offset control circuit 61. The offset control circuit 61 includes resistance elements 62 and 64, capacitors 63 and 65, and an amplifier 66.

The voltage from the node N2 (for example, the normal phase signal of the voltage Vdiff2) is input into one input terminal of the amplifier 66. An L type low-pass filter including the resistance element 62 and the capacitor 63 is provided between the one input terminal of the amplifier 66 and the node N2. Accordingly, an average voltage (the direct-current component) of the voltages from the node N2 is input into one input terminal of the amplifier 66.

The voltage from the node N3 (for example, the reverse phase signal of the voltage Vdiff2) is input into the other input terminal of the amplifier 66. An L type low-pass filter including the resistance element 64 and the capacitor 65 is provided between the other input terminal of the amplifier 66 and the node N3. Accordingly, the average voltage (the direct-current component) of the voltages from the node N3 is input into the other input terminal of the amplifier 66. The resistance element 62 and the resistance element 64 may be set to have the same resistance value, and the capacitor 63 and the capacitor 65 may be set to have the same capacity value.

The amplifier 66 outputs a voltage according to a difference between the average voltage of the normal phase signal and the average voltage of the reverse phase signal of the voltage Vdiff2. The voltage that is output from the amplifier 66 is the voltage according to the value of the offset that occurs in the voltage Vdiff2. The voltage that is output from the amplifier 66 is the voltage suitable for the control of the transistor M2, and is used as the control signal CL3. For example, in a case where the offset that occurs in the voltage Vdiff2 is 0, the control signal CL3 has a predetermined voltage (not 0). For example, the voltage of the control signal CL3 increases as the offset is shifted to the plus side (with reference to FIG. 4 described above), and the voltage of the control signal CL3 decreases as the offset is shifted to the minus side.

Returning to FIG. 1, in this example, the transistor M2 is the FET, and a gate of the transistor M2 functions as a control terminal of the transistor M2. A drain and a source of the transistor M2 respectively function as a first current terminal and a second current terminal of the transistor M2.

In this embodiment, the transistor M2 is a variable current source that is connected between the TIA core 10 and the ground. The drain of the transistor M2 is electrically connected to the input terminal 10a of the TIA core 10 through the node N1. The source of the transistor M2 is electrically connected to the ground. The gate of the transistor M2 is electrically connected to the offset control circuit 61. A gate voltage of the transistor M2 is illustrated as a voltage Vg2. The voltage Vg2 is identical to the voltage of the control signal CL3. The voltage Vg2 is changed according to a voltage change in the control signal CL3, and a current flowing to the source from the drain of the transistor M2 is changed. As described above, the variable current source (the transistor M2) between the input terminal 10a of the TIA core 10 and the ground is controlled by the control signal CL3, and thus, the value of the current Is2 can be controlled. The current Is2 is a direct current (a DC current).

An example of offset compensation will be described. For example, in a case where the current Is2 increases, the direct-current component of the current Iin decreases. The TIA core 10 performs inverting amplification (Gain=−A), and thus, in a case where the direct-current component of the current Iin decreases, a direct-current component of the voltage Vtiaout that is output from the TIA core 10 increases. As described above, the direct-current component of the voltage Vtiaout that is output from the TIA core 10 is controlled, and thus, the offset of the voltage Vdiff1 that is output from the VGA 30 provided on the latter stage of the TIA core 10, and the voltage Vdiff2 that is output from the buffer amplifier 40 can be compensated. Furthermore, the VGA 30 outputs the voltage Vdiff1 on the basis of the voltage Vtiaout and the voltage Vref. For this reason, when the value of the direct-current component (the average voltage (a center voltage)) of the voltage Vtiaout is coincident with the voltage of the voltage Vref, the offset of the voltage Vdiff1 is 0, and in a case where the direct-current component of the voltage Vtiaout is shifted from such a state, an offset occurs. According to the offset compensation, the value of the direct-current component of the current Iin is controlled such that the voltage Vtiaout is identical to the voltage Vref.

In this embodiment, an impedance when each unit is seen from the node N1, for example, is in a relationship as described below. In a case where the value of the (alternating-current) impedance when the input terminal 10a of the TIA core 10 is seen from the node N1 is set to Rtia, Rtia may be designed to be approximately 30Ω to 100Ω. The value of the impedance when the transistor M1 and the dummy TIA 20 are seen from the node N1 may be designed to be down to approximately half of Rtia. The voltage of the input terminal 20a of the dummy TIA 20 may be designed to be identical to the voltage of the input terminal 10a of the TIA core 10. In this case, a potential difference between the drain and the source of the transistor M1 decreases, and the transistor M1 is operated in a linear region, and thus, functions as a variable resistance. In such a linear region operation, the voltage of the control signal that is input into the gate of the transistor M1 is set to a voltage value that is greater than the voltage value of the drain and the voltage value of the source (a voltage between the drain and the source). In addition, the potential difference between the drain and the source is small, and thus, the DC current does not flow. The value of the alternating-current impedance when the transistor M2 and the ground are seen from the node N1 is sufficient larger than that of Rtia, and for example, may be designed to several hundred kΩ to several MΩ. A voltage of approximately 0.9 V is applied between the drain and the source of the transistor M2, and the transistor M2 is operated in a saturation region, and thus, is operated as a variable current source, and the DC current flows. In such a saturation region operation, the voltage of the control signal that is input into the gate of the transistor M2 is set to a voltage value between the voltage value of the drain and the voltage value of the source. According to such impedance design, the transistor M1 functions as an element in which the impedance decreases, and thus, the signal component (an alternating-current component) of the current Ipd diverges, but the direct-current component does not flow (the principle will be described below). On the other hand, the transistor M2 functions as an element in which the direct-current component of the current Ipd diverges, but the impedance is higher than that of the transistor M1, and the signal component does not flow. It should be noted that the current Is2 flows by the transistor M2, and thus, there is a possibility that the input bias voltage (Vb1) of the TIA core 10 fluctuates, and therefore, there is a case where a potential difference is generated between the input bias voltage (Vb1) of the TIA core 10 and the input bias voltage (Vb2) of the dummy TIA 20, that is, the drain and the source of the transistor M1. However, in a case where the DC current flowing through the transistor M1 is sufficiently smaller than the current Is1, the influence can be neglected. Furthermore, as necessary, the voltage value of the input bias voltage (Vb1) of the TIA core 10 is detected, and a circuit controlling the voltage value of the input bias voltage (Vb2) of the dummy TIA 20 such that the voltage value of the input bias voltage (Vb2) of the dummy TIA 20 is identical to the voltage value of the input bias voltage (Vb1) of the TIA core 10 may be added.

Figure 6A:
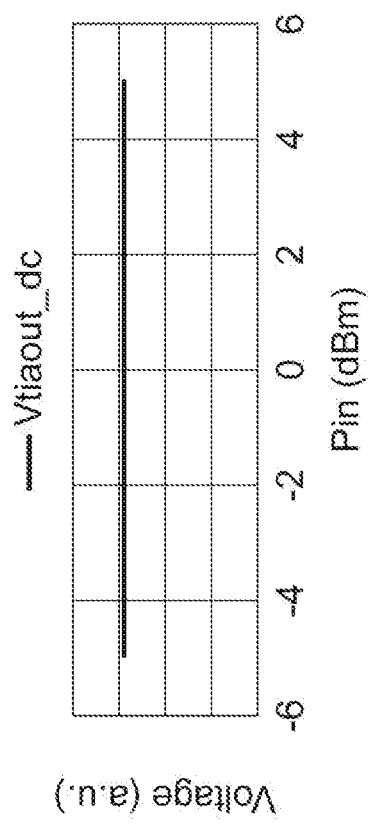
FIG. 6A is a diagram illustrating an example of an operation of an AOC circuit.
Figure 6B:
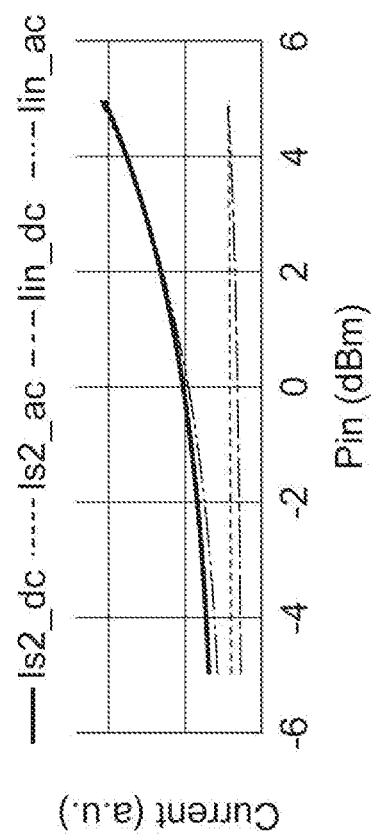
FIG. 6B is a diagram illustrating an example of the operation of the AOC circuit.

FIG. 6A and FIG. 6B are diagrams illustrating an example of the operation of the AOC circuit 60. In a graph of FIG. 6A, a horizontal axis represents input power Pin (dBm) of an optical signal, and a vertical axis represents an input voltage (arbitrary unit). An input voltage represented by the vertical axis indicates a value (Vtiaout_dc) of the direct-current component of the voltage Vtiaout (FIG. 1). As illustrated in the graph, even in a case where the input power Pin increases, Vtiaout_dc is not changed, but is constant (the voltage of the voltage Vref of FIG. 1). Therefore, an offset does not occur in the voltage Vdiff1 that is output from the VGA 30 and the voltage Vdiff2 that is output from the buffer amplifier 40.

In a graph of FIG. 6B, a horizontal axis represents the input power Pin (dBm) of the optical signal, and a vertical axis represents a current (arbitrary unit). The current represented on the vertical axis indicates a value (Is2_dc) of a direct-current component of the current Is2 (FIG. 1), a value (Is2_ac) of an alternating-current component of the current Is2, a value (Iin_dc) of a direct-current component of the current Iin, and a value (Iin_ac) of an alternating-current component of the current Iin. As illustrated in the graph, in a case where the input power Pin increases, Is2_dc also increases, and Iin_dc is retained to be constant. Therefore, the offset does not occur. In addition, in a case where the input power Pin increases, Iin_ac increases, but Is2_ac is retained to be constant. As described above, Iin_ac that is the signal component (the alternating-current component) input into the TIA core 10 is not affected by Is2_ac.

Returning FIG. 1, as described above, in this embodiment, the bias voltage (the voltage Vb2) having the same value as that of the bias voltage (the voltage Vb1) that is applied to the input terminal 10a of the TIA core 10 is applied to the input terminal 20a of the dummy TIA 20. Accordingly, potentials between the drain and the source of the transistor M1 are the same, and thus, the current Is1 flowing through the transistor M1 is controlled such that the current Is1 does not include the direct-current component. The current Is1 flowing through the transistor M1 does not include the direct-current component, and thus, the value of the direct-current component of the current Is2 flowing through the transistor M2 is not affected by the transistor M1, and is controlled by the transistor M2. Accordingly, it is possible to prevent the current Is1 flowing through the transistor M1 and the current Is2 flowing through the transistor M2 (that is, the AGC circuit 50 and the AOC circuit 60) from interfering with each other. As a result thereof, the AGC circuit 50 and the AOC circuit 60 are suitably operated, and thus, the linearity of the TIA 1 can be improved.

Furthermore, in a case of considering a circuit configuration in which an input terminal of a core amplifier, for example, is connected to a power source through a bipolar transistor by the AGC circuit, as an examination example (a comparative example), the following problems occur. First, a current flowing through the transistor of the AOC circuit is the disturbance of the AGC circuit. This is because a detection result (an apparent amplitude value) of an amplitude value of a differential voltage signal that is output from a differential amplifier fluctuates by the offset compensation of the AOC circuit, and affects the voltage detection of the AGC circuit. The detection result also affects the current flowing through the bipolar transistor (for example, an emitter) of the AGC circuit. In the circuit configuration of the examination example, the input terminal of the core amplifier is connected to the ground through the bipolar transistor, and thus, the current flowing through the bipolar transistor includes a direct-current component according to a potential difference between the input terminal and the power source. Therefore, in a case where the current flowing through the bipolar transistor of the AGC circuit is affected, and fluctuates, a direct-current voltage of the input terminal of the TIA core also fluctuates. As a result thereof, the offset of the differential voltage signal fluctuates, and is the disturbance of the AOC circuit. As described above, in the circuit configuration of the comparative example, the AOC circuit is the disturbance of the AGC circuit, and the AGC circuit is the disturbance of the AOC circuit (a loop of disturbance is generated between the AOC circuit and the AGC circuit), and thus, the AOC circuit and the AGC circuit interfere with each other.

Furthermore, in the circuit configuration of the examination example described above, it is also considered that time constants (a response speed) of AOC and AGC are designed to be sufficiently different from each other, and thus, mutual interference is reduced. However, in a case where wideband transmission properties are required as with an optical communication application, it is necessary to set a cutoff frequency, for example, to be less than or equal to several hundred kHz. In order to obtain such a low cutoff frequency, a resistor having a large resistance value, and a capacitor having a large capacity value are required, and thus, an increase in the area, the cost, and the like is caused.

In contrast, in the TIA 1 according to this embodiment, as described above, the current Is1 flowing through the transistor M1 of the AGC circuit 50 does not include the direct-current component, and thus, the direct-current voltage of the input terminal 10a of the TIA core 10 does not fluctuate by the current Is1, and the AGC circuit 50 is not the disturbance of the AOC circuit 60. Therefore, it is possible to prevent the AGC circuit 50 and the AOC circuit 60 from interfering with each other (the loop of the disturbance from being generated).

The effect of the TIA 1 described above will be described with reference to FIGS. 7A to 7D and FIGS. 8A to 8D.

FIGS. 7A to 7D are graphs illustrating an example of the properties of the circuit configuration of the comparative example. The circuit configuration of the comparative example is different from that of the TIA 1 (FIG. 2) in that the transistor M1 is fixed in an off state.

Figure 7A:
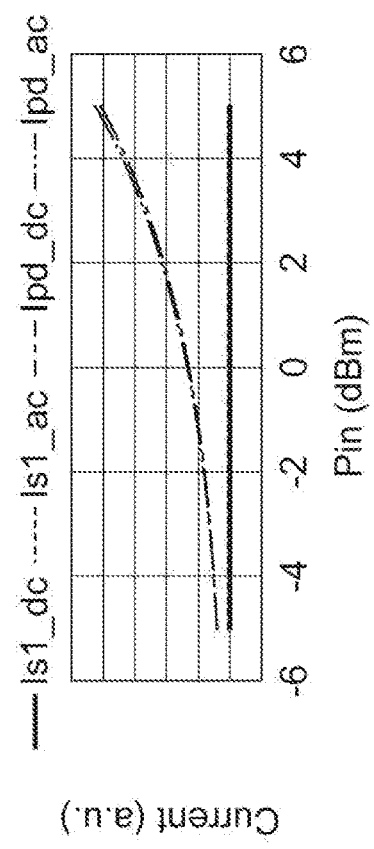
FIG. 7A is a diagram illustrating an example of an operation of a circuit configuration of a comparative example.

In the graph of FIG. 7A, a horizontal axis represents an input power (dBm) of an optical signal, and a vertical axis represents an amplitude value (arbitrary unit). The amplitude value represented on the vertical axis indicates each of the amplitude value of the voltage Vtiaout, the amplitude value of the voltage Voutp, the amplitude value of the voltage Voutn, and the amplitude value of the voltage Vout (FIG. 1). A curve representing the voltage Voutp and a curve representing the voltage Voutn overlap with each other. As illustrated in the graph, in a case where the input power Pin increases, the voltage Vtiaout also increases. The voltage Voutp, the voltage Voutn, and the voltage Vout are a constant amplitude value in a region where the input power Pin is large to an extent (in this example, greater than or equal to −3 dBm), but in a case where the input power Pin excessively increases (in this example, greater than or equal to 4 dBm), the voltage decreases. This indicates that the amplifier is saturated.

Figure 7C:
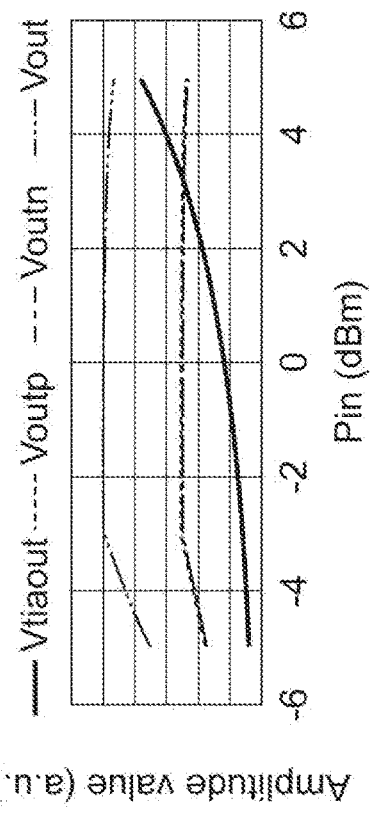
FIG. 7C is a diagram illustrating an example of the operation of the circuit configuration of the comparative example.
Figure 7B:
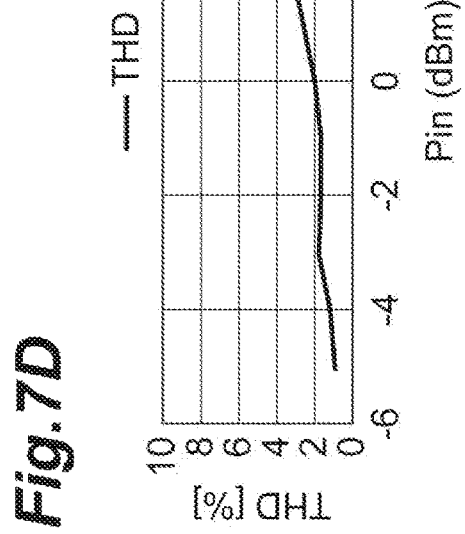
FIG. 7B is a diagram illustrating an example of the operation of the circuit configuration of the comparative example.

In the graph of FIG. 7B, a horizontal axis represents the input power Pin (dBm) of the optical signal, and a vertical axis represents a voltage (arbitrary unit). A voltage represented on the vertical axis is the voltage Vg1 that is the gate voltage of the transistor M1. As described above, in the circuit according to the comparative example, the transistor M1 is set in the off state, and thus, even in a case where the input power Pin increases, the voltage Vg1 remains low (0).

In the graph of FIG. 7C, a horizontal axis represents the input power Pin (dBm) of the optical signal, and a vertical axis represents a current value (arbitrary unit). A current represented on the vertical axis is a direct-current component (Is1_dc) of the current Is1, an alternating-current component (Is1_ac) of the current Is1, a direct-current component (Ipd_dc) of the current Ipd, and an alternating-current component (Ipd_ac) of the current Ipd. A curve representing Is1_dc and a curve representing Is1_ac overlap with each other. As illustrated in the graph, in a case where the input power Pin increases, both of Ipd_dc and Ipd_ac increase. As described above, in the circuit according to the comparative example, the transistor M1 is fixed in the off state, and thus, both of Is1_dc and Is1_ac remain small (0).

Figure 7D:
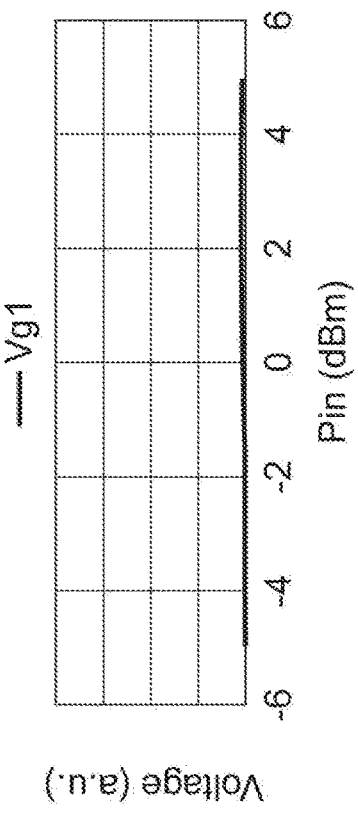
FIG. 7D is a diagram illustrating an example of the operation of the circuit configuration of the comparative example.

In the graph of FIG. 7D, a horizontal axis represents the input power Pin (dBm) of the optical signal, and a vertical axis represents total harmonic distortion (THD, %) of the voltage Vout (FIG. 1). As illustrated in the graph, in the circuit according to the comparative example, in a case where the input power Pin increases, THD also increases. For example, in a region where the input power Pin is greater than 2 dBm, THD increases to approximately 4% to 10%. This is because the amplification action of the amplifier is saturated, as described above.

FIGS. 8A to 8D are graphs illustrating an example of the operation of the TIA 1 according to the embodiment. The graphs of FIGS. 8A to 8D respectively correspond to the graphs of FIGS. 7A to 7D, and thus, the description of parts having the same properties will be omitted.

Figure 8C:
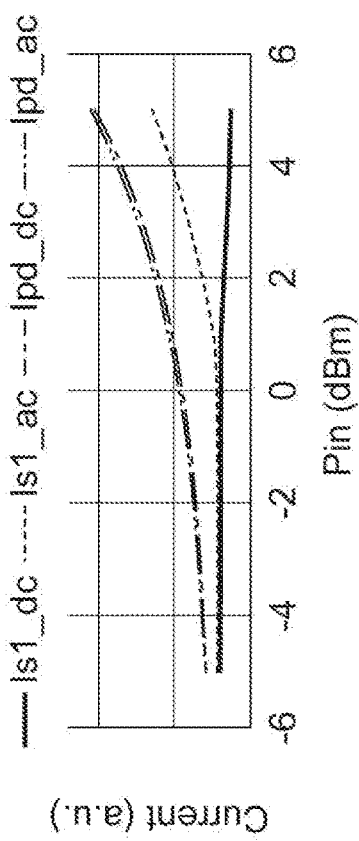
FIG. 8C is a diagram illustrating an example of the operation of the TIA.
Figure 8D:
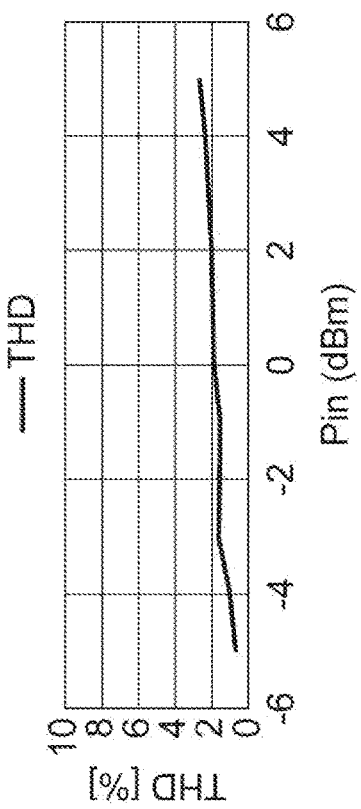
FIG. 8D is a diagram illustrating an example of the operation of the TIA.
Figure 8A:
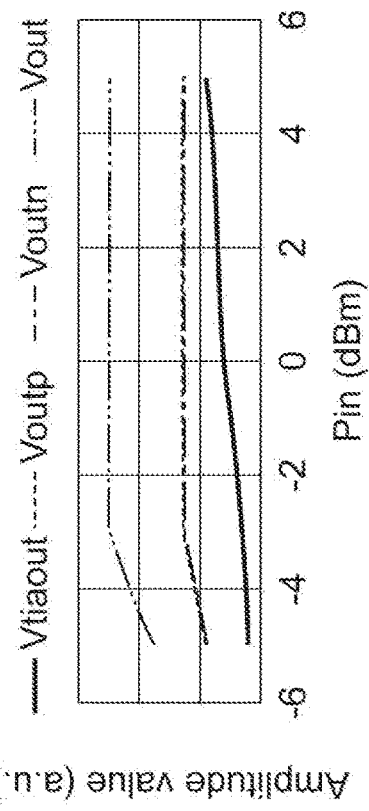
FIG. 8A is a diagram illustrating an example of an operation of the TIA.

As illustrated in the graph of FIG. 8A, in the TIA 1, in a case where the input power Pin is greater than −3 dBm, the voltage Voutp, the voltage Voutn, and the voltage Vout are respectively a constant value. At this time, the AGC circuit 50 suppresses the gain of the VGA 30 such that the voltage Voutp, the voltage Voutn, and the voltage Vout maintain a constant value of the amplitude. That is, the voltage Vtiaout increases along with the input power Pin, but the gain of the VGA 30 decreases by the AGC circuit 50, and thus, the VGA 30, the buffer amplifier 40, and the CML 70 perform the linear amplification operation. Accordingly, the TIA 1 is in a state of not being saturated.

Figure 8B:
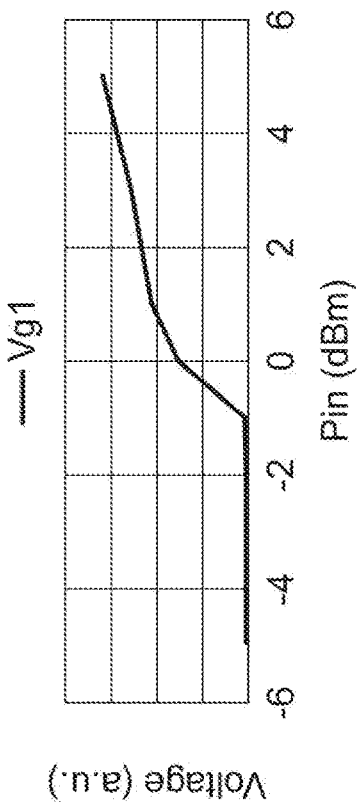
FIG. 8B is a diagram illustrating an example of the operation of the TIA.

As illustrated in the graph of FIG. 8B, in a case where the input power Pin increases, the voltage Vg1 also increases. Accordingly, control is performed such that the resistance value between the drain and the source of the transistor M1, that is, the resistance value (the impedance) between the input terminal 10a of the TIA core 10 and the input terminal 20a of the dummy TIA 20 decreases.

As illustrated in the graph of FIG. 8C, in a case where the input power Pin increases, Is1_ac also increases. This is because the resistance value between the drain and the source of the transistor M1 decreases. As described above, the impedance when the transistor M1 is seen from the node N1 relatively decreases with respect to the input impedance when the TIA core 10 is seen from the node N1, and thus, the current Is1 (the alternating-current current) increases. For example, in a case where the input power Pin is greater than 0 dBm, Vg1 sufficiently increases (with reference to FIG. 8B), and the current Is1_ac increases (with reference to FIG. 8C).

As illustrated in the graph of FIG. 8D, even in a case where the input power Pin increases, THD rarely increases. For example, even in the region where the input power Pin is greater than 2 dBm, THD is less than 3%. This indicates that the TIA 1 is not saturated. Therefore, in the TIA 1 according to the embodiment, the linearity is improved.

As described above, the TIA 1 includes the TIA core 10, the dummy TIA 20, the VGA 30, the buffer amplifier 40, the transistor M1, and the transistor M2. The TIA core 10 includes the input terminal 10a, and generates the voltage Vtiaout according to (in response to) the current Iin that is input into the input terminal 10a. The dummy TIA 20 includes the input terminal 20a, and generates the voltage signal according to (in response to) the current Is1 that is input into the input terminal 20a. The VGA 30 is electrically connected to the TIA core 10, and generates the voltage Vdiff1 according to (in response to) the voltage Vtiaout. The transistor M1 is the variable resistance element that is electrically connected between the input terminal 10a of the TIA core 10 and the input terminal 20a of the dummy TIA 20, and has the resistance value varied according to the amplitude value of the voltage Vdiff1. The transistor M2 is the variable current source that is electrically connected between the input terminal 10a of the TIA core 10 and the ground, and controls (varies) the current value of the current Is2 flowing to the ground from the input terminal 10a of the TIA core 10 (or the input terminal 2) according to the value of the offset of the voltage Vdiff2 (or the voltage Vdiff1). The terminal 10a is biased to a voltage value (the voltage Vb1) equal to a voltage value (the voltage Vb2) to which the terminal 20a is biased.

According to the TIA 1 described above, a part of the current Ipd is capable of flowing to the dummy TIA 20 through the transistor M1. The resistance value between the drain and the source of the transistor M1 is controlled according to the amplitude value of the voltage Vdiff2, and thus, functions as the AGC circuit 50 controlling the value of the alternating-current component of the current Iin that is input into the TIA core 10. In addition, a part of the current Ipd is capable of flowing to the ground through the transistor M2. The value of the current flowing between the drain and the source of the transistor M2 is controlled according to the value of the output offset of the VGA 30 or the buffer amplifier 40, and thus, functions as the AOC circuit 60 controlling the value of the direct-current component of the current Iin that is input into the TIA core 10. Here, the bias voltage (the voltage Vb2) having the same value as that of the bias voltage (the voltage Vb1) that is applied to the input terminal 10a of the TIA core 10 is applied to the input terminal 20a of the dummy TIA 20. Accordingly, the potentials between the drain and the source of the transistor M2 are the same, and thus, the current Is1 flowing through the transistor M1 is controlled such that the current Is1 does not include the direct-current component. The current Is1 flowing through the transistor M1 does not include the direct-current component, and thus, the value of the direct-current component of the current Is2 flowing through the transistor M2 is controlled by the transistor M2 without being affected by the current Is1 flowing through the transistor M1. Therefore, it is possible to prevent the current Is1 flowing through the transistor M1 and the current Is2 flowing through the transistor M2 (that is, the AGC circuit 50 and the AOC circuit 60) from interfering with each other. As a result thereof, the AGC circuit 50 and the AOC circuit 60 are suitably operated, and thus, the linearity of the TIA 1 can be improved. Further, the AOC circuit 60 is also suitably operated, and thus, the offset of the TIA 1 can also be suitably compensated. It should be noted that the drain and the source of the transistor M2 are set to have the same potential, and thus, the drain and the source of the transistor M1 may be connected by being switched.

The transistor M1 is the FET including the drain that is electrically connected to the input terminal 20a, the source that is electrically connected to the input terminal 20a, and the gate, and the control signal CL2 that is generated according to the amplitude of the voltage Vdiff2 (or the voltage Vdiff1) may be input into the gate. Accordingly, the variable resistance element can be realized by using the FET. In addition, in the TIA 1, the control signal CL2 that is input into the gate of the transistor M1 can be obtained by using the control signal CL1. This is because the control signal CL1 that is used in the gain control of the VGA 30 is the signal that is generated on the basis of the amplitude value of the voltage Vdiff1 that is output from the VGA 30 (and the voltage Vdiff2 that is output from the buffer amplifier 40). Therefore, for example, the control signal CL1 that is originally used in the VGA 30 can be effectively utilized.

The resistance value between the input terminal 10a and the input terminal 20a of the transistor M1 may be set to the first resistance value when the value of the current Iin is smaller than the predetermined value, and may be set to the second resistance value that is less than the first resistance value when the value of the current Iin is larger than the predetermined value. Accordingly, the resistance value of the transistor M1 is set to a comparatively small value (the second resistance value) when the current Iin is comparatively large (greater than the predetermined value), and a part of the current Ipd easily flows to the dummy TIA 20 through the transistor M1. As a result thereof, the value of the current Iin that is input into the TIA core 10 is suppressed, and the AGC suitably functions.

Figure 9:
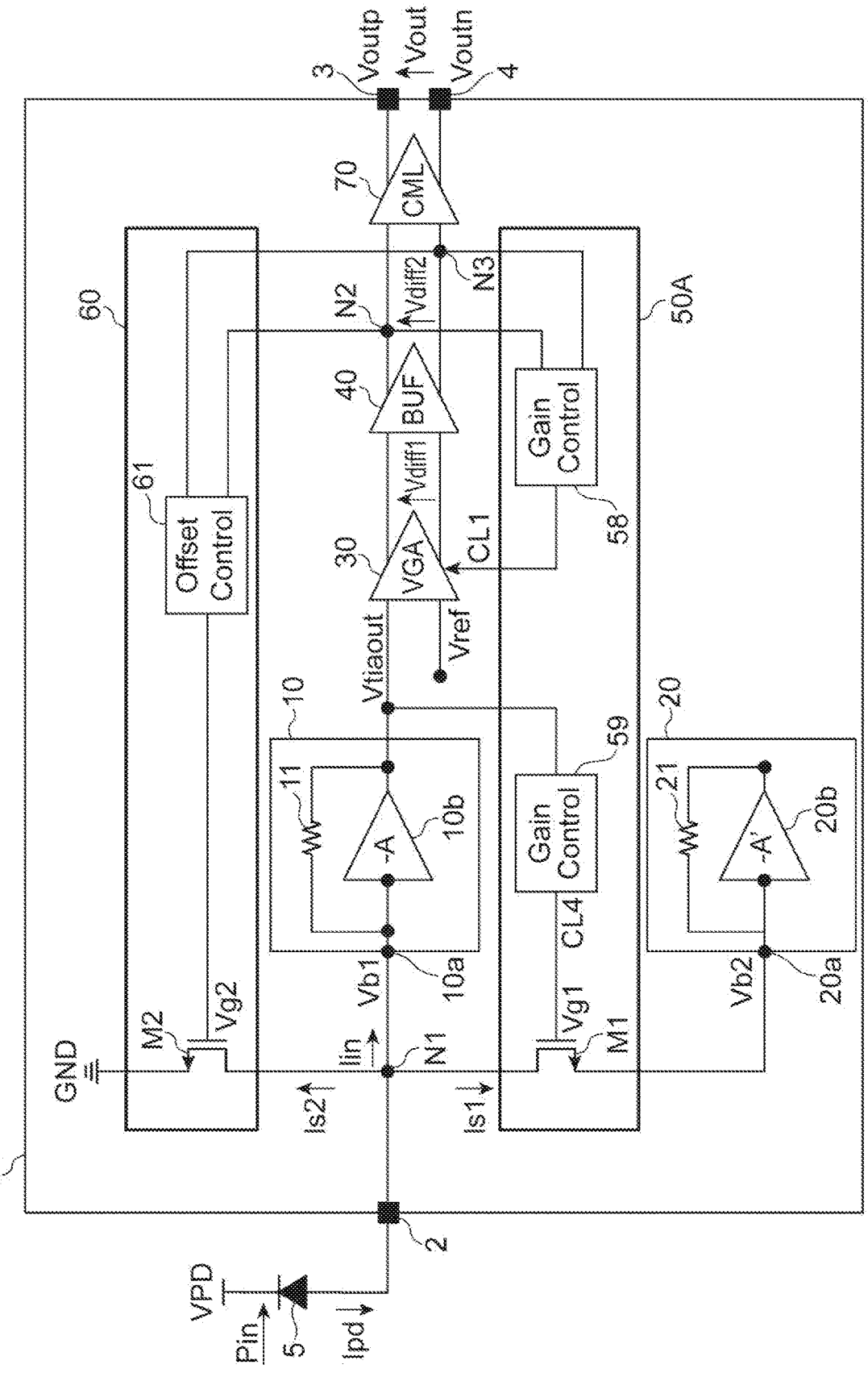
FIG. 9 is a diagram illustrating a schematic configuration of a TIA according to a modification example.

As described above, one embodiment of the present disclosure has been described, but the present invention is not limited to the embodiment described above. In the embodiment described above, a method of controlling the transistor M1 by the control signal CL2 generated on the basis of the voltage Vdiff2 that is output from the buffer amplifier 40 (of the voltage Vdiff1 that is output from the VGA 30) has been described. However, the method of controlling the transistor M1 is not limited thereto. For example, the transistor M1 can also be controlled by generating the control signal on the basis of the voltage Vtiaout that is output from the TIA core 10. FIG. 9 illustrates an example of a circuit configuration in which such control can be performed. A TIA 1A illustrated in FIG. 9 is different from the TIA 1 (FIG. 1) in that an AGC circuit 50A is provided instead of the AGC circuit 50.

The AGC circuit 50A is different from the AGC circuit 50 in that the gain control circuit 51 and the amplifier 56 are not provided, but a control circuit 58 and a control circuit 59 are provided. The control circuit 58 outputs the control signal CL1. The control signal CL1 and the circuit configuration for generating the control signal CL1 are as described above, and thus, the description will not be repeated. The control circuit 59 outputs a control signal CL4, on the basis of the voltage Vtiaout that is output from the TIA core 10. For example, the voltage of the control signal CL4 increases as the voltage Vtiaout increases. The control signal CL4 is input into the gate of the transistor M1. From the circuit configuration of the gain control circuit 51 exemplified in FIG. 3, the control circuit 59, for example, can be configured such that the connection portion with respect to the node N2 is connected to the output terminal of the TIA core 10, but the connection portion with respect to the node N3 is not provided. A portion connected to the node N3 may be connected to the ground.

In the TIA 1A illustrated in FIG. 9, the control signal CL4 that is generated on the basis of the amplitude value of the voltage Vtiaout that is output from the TIA core 10 is input into the gate of the transistor M1. In this manner, the variable resistance element can also be realized by using the transistor M1. Therefore, as with the TIA 1 (FIG. 1), the linearity can also be improved by the TIA 1A. Further, the AOC circuit 60 is also suitably operated, and thus, the offset of the TIA 1A is also suitably compensated.

In the above description, an example has been described in which the transistors (the transistor M1 and the transistor M2) are used as the variable resistance element and the variable current source. A variable resistor may be used as the variable resistance element. A resistance value of the variable resistor is changed according to the control signal (the control signals CL1, CL3, and CL4), and thus, the linearity of the TIA can also be improved.

In the above description, an example has been described in which the AGC circuit 50 and the AOC circuit 60 generate the control signals CL1 to CL4, on the basis of the voltage Vdiff2 that is output from the buffer amplifier 40. Alternatively, the AGC circuit 50 and the AOC circuit 60 may generate the control signals CL1 to CL4, on the basis of the voltage Vdiff1 that is output from the VGA 30. In this case, the TIA 1 and the TIA1A (FIG. 1 and FIG. 9) can also be configured not to include the buffer amplifier 40.

In a case where the voltage Vdiff1 that is output from the VGA 30 or the voltage Vdiff2 that is output from the buffer amplifier 40 has sufficient driving capability, the TIA 1 and the TIA 1A (FIG. 1 and FIG. 9) can also be configured not to include the CML 70.

What is claimed is:

1. A transimpedance amplifier that receives an input current signal from a photodetector, and outputs a differential voltage signal, the amplifier comprising:
    an input terminal configured to receive the input current signal;
    a first amplifier including a first input terminal electrically connected to the input terminal, and generating a first voltage signal in response to a first current signal input into the first input terminal;
    a second amplifier including a second input terminal, and generating a second voltage signal in response to a second current signal input into the second input terminal;
    a differential amplifier electrically connected to the first amplifier, the differential amplifier being configured to generate the differential voltage signal in response to a difference between the first voltage signal and a reference voltage signal;
    a variable resistance element electrically connected between the first input terminal and the second input terminal, the variable resistance element having a resistance value varied according to an amplitude value of the first voltage signal or an amplitude value of the differential voltage signal; and
    a variable current source electrically connected between the first input terminal and a ground, the variable current source being configured to vary a current value of a direct current flowing to the ground from the input terminal according to a value of an offset of the differential voltage signal,
    wherein the first input terminal is biased to a voltage value equal to a voltage value to which the second input terminal is biased.

2. The transimpedance amplifier according to claim 1, wherein the variable resistance element is an FET including a first current terminal electrically connected to the first input terminal, a second current terminal electrically connected to the second input terminal, and a control terminal receiving a control signal generated according to the amplitude value of the first voltage signal or the amplitude value of the differential voltage signal, the FET varying a resistance value between the first current terminal and the second current terminal in response to the control signal.

3. The transimpedance amplifier according to claim 1, wherein the resistance value of the variable resistance element between the input terminal and the second input terminal is set to a first resistance value when a value of the first current signal is smaller than a predetermined value, and is set to a second resistance value less than the first resistance value when the value of the first current signal is larger than the predetermined value.

4. The transimpedance amplifier according to claim 1, wherein the first amplifier includes a bipolar transistor, the bipolar transistor of the first amplifier includes a base electrically connected to the first input terminal, a collector electrically connected to a power supply line, and an emitter electrically connected to the ground, the first input terminal is biased to a bias voltage including a base-emitter voltage of the bipolar transistor of the first amplifier,
    the second amplifier includes a bipolar transistor,
    the bipolar transistor of the second amplifier includes a base electrically connected to the second input terminal, a collector electrically connected to the power supply line, and an emitter electrically connected to the ground, and
    the second input terminal is biased to a bias voltage including a base-emitter voltage of the bipolar transistor of the second amplifier.

5. The transimpedance amplifier according to claim 1, wherein the variable current source has an alternating-current impedance when the variable current source is seen from the first input terminal, and the alternating-current impedance is set to be greater than an alternating-current impedance of the variable resistance element when the variable resistance element is seen from the first input terminal.

6. The transimpedance amplifier according to claim 2, wherein the control terminal of the FET receives the control signal set to a voltage value greater than a voltage value of the first current terminal and a voltage value of the second current terminal.

7. The transimpedance amplifier according to claim 1,
wherein the variable current source is an FET including a
first current terminal electrically connected to the input terminal, a second current terminal electrically connected to the ground, and a control terminal, and
the control terminal of the FET receives a control signal generated according to an offset of the differential voltage signal.

8. The transimpedance amplifier according to claim 7,
wherein the control signal is set to a voltage value between a voltage value of the first current terminal and a voltage value of the second current terminal.

\* \* \* \* \*